(12) United States Patent
Takafuji et al.

(10) Patent No.: US 7,262,464 B2
(45) Date of Patent: Aug. 28, 2007

(54) SEMICONDUCTOR DEVICE WITH SINGLE CRYSTAL SEMICONDUCTOR LAYER(S) BONDED TO INSULATING SURFACE OF SUBSTRATE

(75) Inventors: Yutaka Takafuji, Nara (JP); Takashi Itoga, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 0 days.

(21) Appl. No.: 11/046,724

(22) Filed: Feb. 1, 2005

(65) Prior Publication Data

US 2005/0173761 A1    Aug. 11, 2005

(30) Foreign Application Priority Data

Feb. 10, 2004    (JP) .............................. 2004-032891

(51) Int. Cl.
*H01L 27/01* (2006.01)
(52) U.S. Cl. .................. 257/347; 257/51; 257/67; 257/68; 257/69; 257/353
(58) Field of Classification Search ................ 257/347, 257/59, 72, 258, 292, 452; 438/149, 479, 438/517
See application file for complete search history.

(56) References Cited

U.S. PATENT DOCUMENTS

| 5,281,840 | A | 1/1994 | Sarma | |
| 6,583,440 | B2 * | 6/2003 | Yasukawa | 257/59 |
| 2002/0179908 | A1 * | 12/2002 | Arao | 257/72 |
| 2003/0113961 | A1 * | 6/2003 | Horiuchi et al. | 438/157 |
| 2003/0183876 | A1 | 10/2003 | Takafuji et al. | |
| 2004/0061176 | A1 | 4/2004 | Takafuji et al. | 257/347 |
| 2004/0150043 | A1 * | 8/2004 | Holm et al. | 257/347 |

FOREIGN PATENT DOCUMENTS

| EP | 1 526 567 | | 4/2005 |
| JP | 04-103174 | * | 4/1992 |
| WO | WO 93/15589 | | 8/1993 |

OTHER PUBLICATIONS

J.P. Salerno, "Single Crystal Silicon AMLCDs", Conference Record of the 1994 International Display Research Conference (IDRC), pp. 39-44, 1994.
Q.Y. Tong et al., "Semiconductor Wafer Bonding: Science and Technology", John Wiley & Sons, Inc., 1999.
European Search Report dated Jan. 22, 2007.

* cited by examiner

*Primary Examiner*—Sue A. Purvis
*Assistant Examiner*—Tan Tran
(74) *Attorney, Agent, or Firm*—Nixon & Vanderhye P.C.

(57) ABSTRACT

A semiconductor device includes a substrate with an insulating surface and a single crystal semiconductor layer, which is bonded to the insulating surface of the substrate. The device further includes a first insulating layer, which is provided between the insulating surface of the substrate and the single crystal semiconductor layer, and a second insulating layer, which has been deposited on the entire insulating surface of the substrate except an area in which the first insulating layer is present.

13 Claims, 6 Drawing Sheets

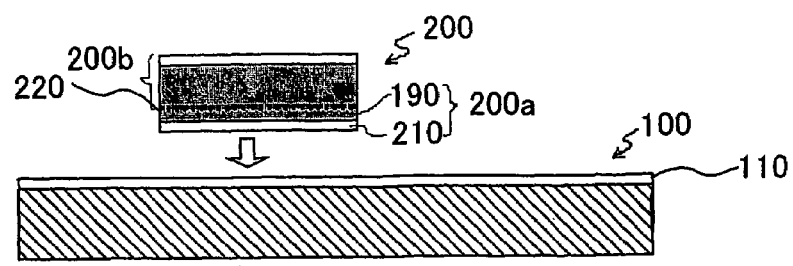
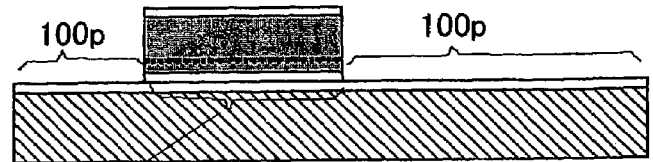
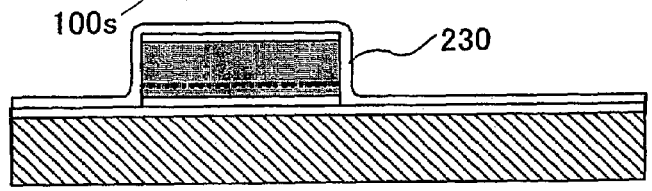
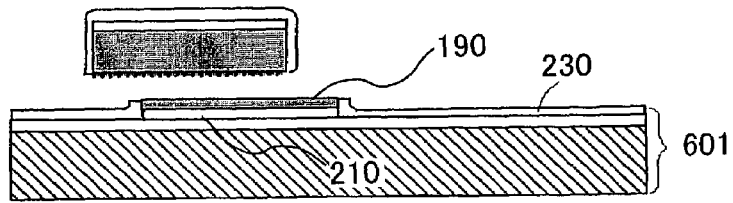
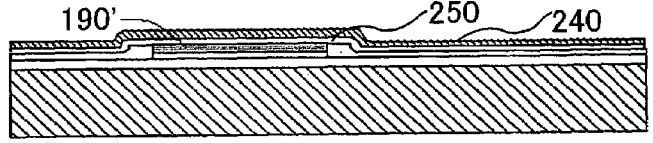
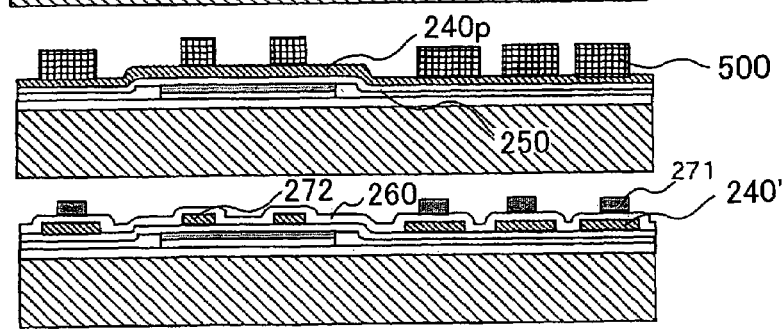
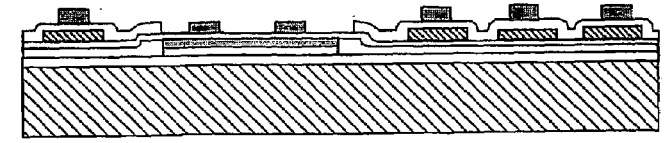
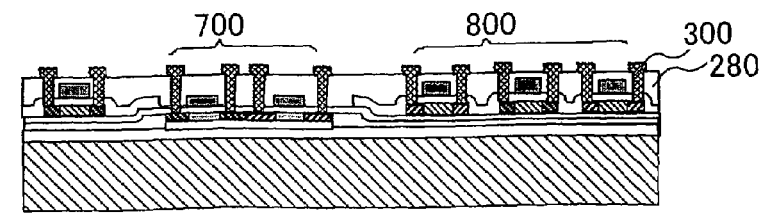

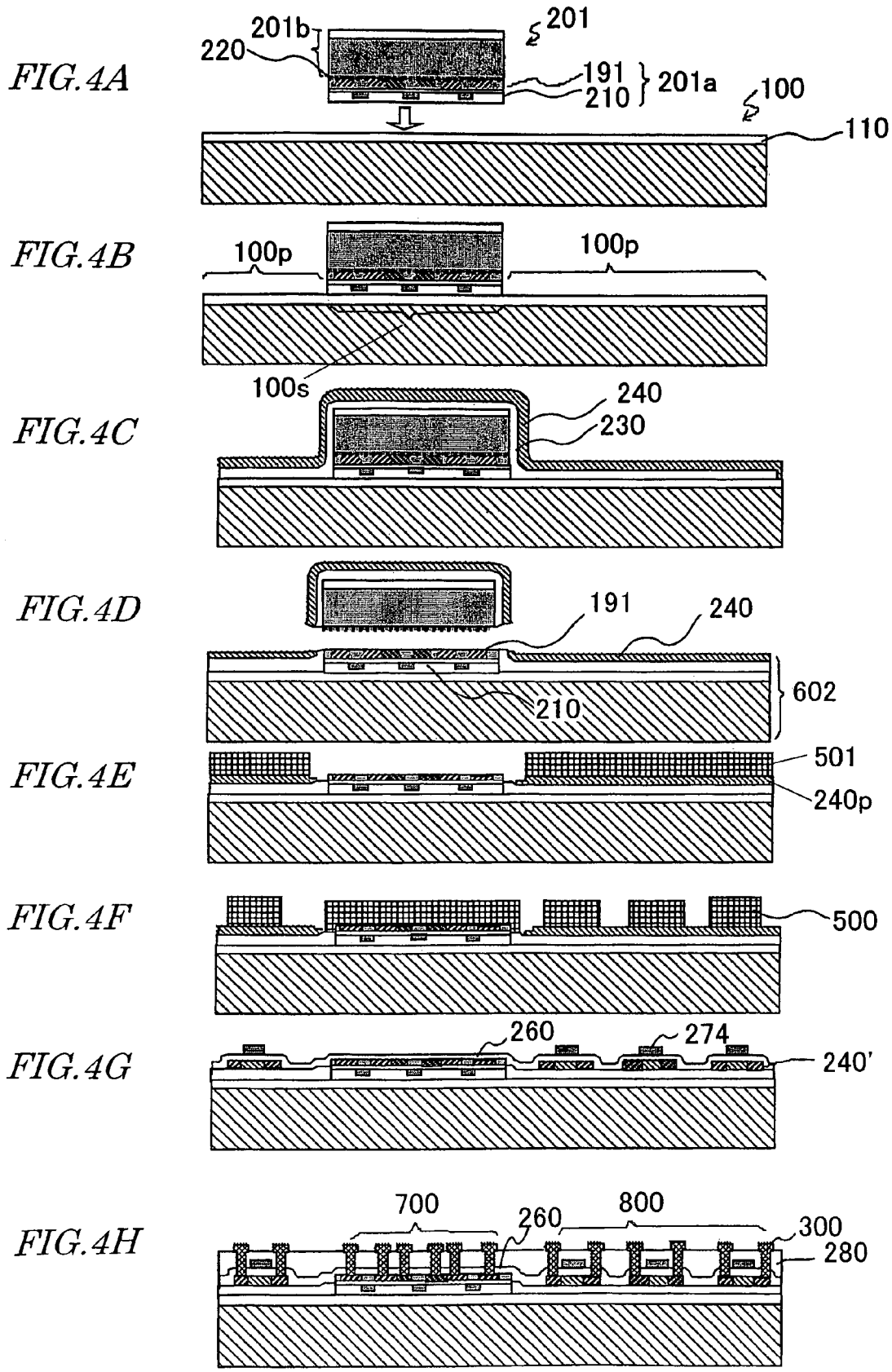

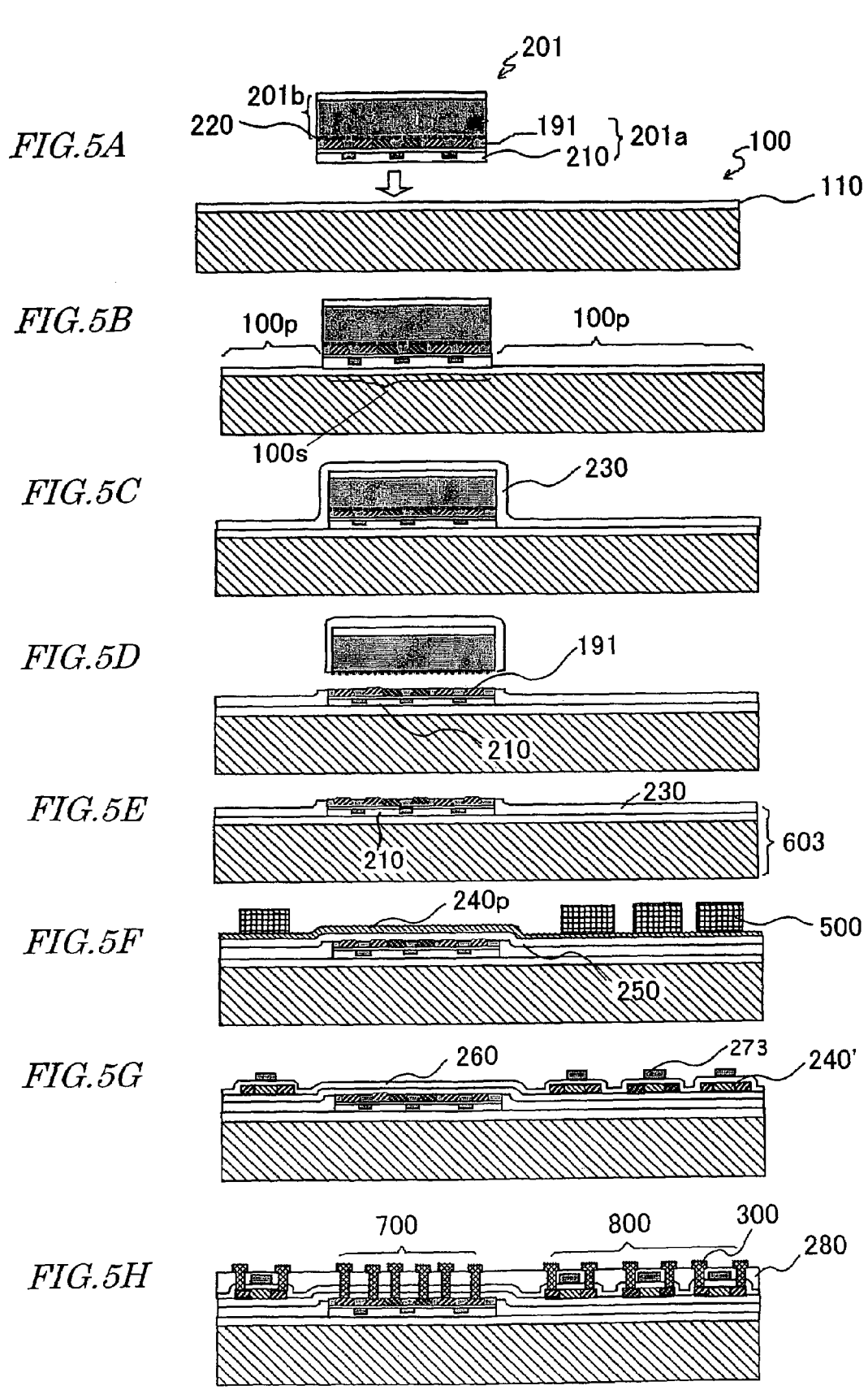

PRIOR ART
FIG.6A
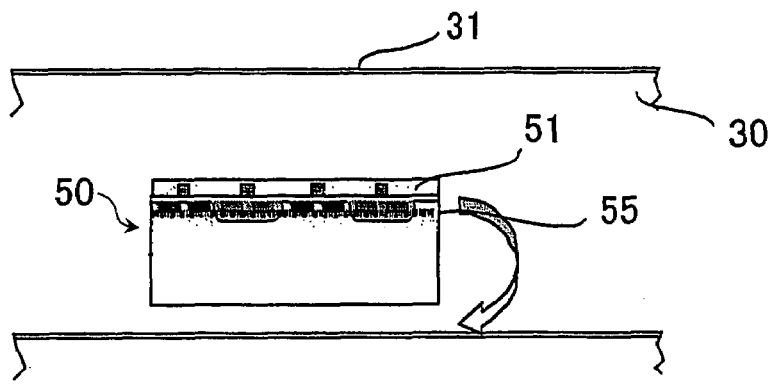
FIG.6B
FIG.6C
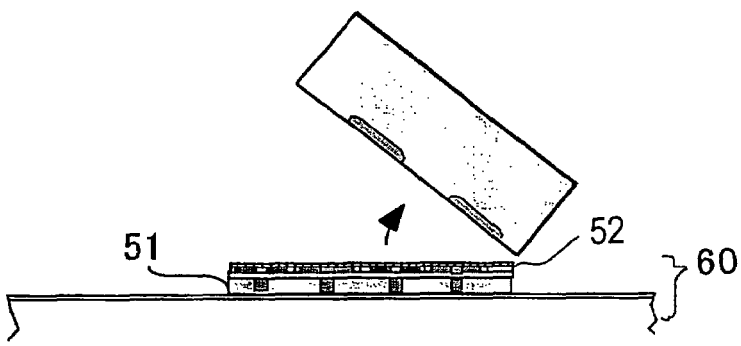
FIG.6D
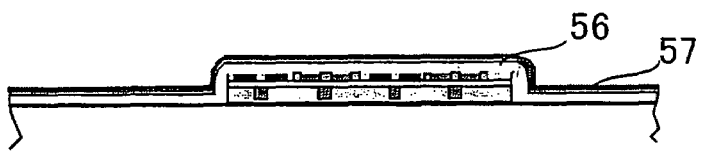
FIG.6E
FIG.6F
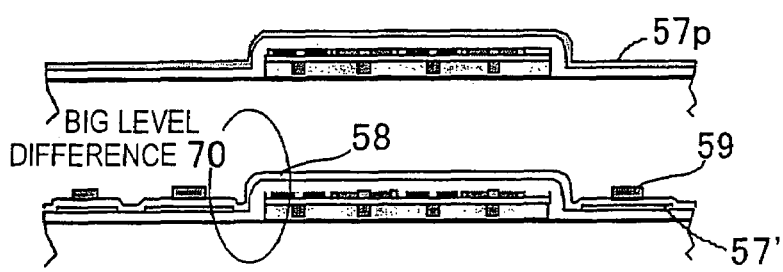
FIG.6G
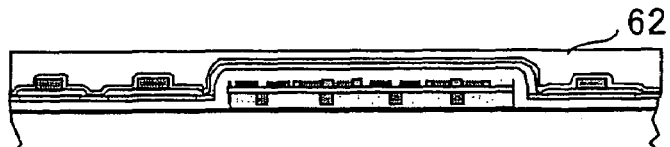
FIG.6H
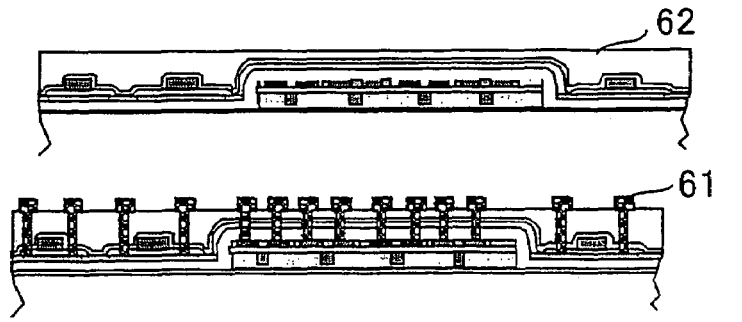

SEMICONDUCTOR DEVICE WITH SINGLE CRYSTAL SEMICONDUCTOR LAYER(S) BONDED TO INSULATING SURFACE OF SUBSTRATE

BACKGROUND OF THE INVENTION

1. Field of the Invention

The present invention relates to a semiconductor device and a method for fabricating the device.

2. Description of the Related Art

An active-matrix-addressed display uses an active-matrix substrate on which a huge number of thin-film transistors (TFTs) are arranged in matrix. Those TFTs are integrated together on a substrate of an insulating material such as glass by thin film deposition, photolithography, and other manufacturing technologies similar to normal LSI manufacturing technologies. More particularly, a silicon thin film is deposited on a substrate by a CVD process, for example, and then patterned into a plurality of islands, which will be eventually used as active areas for respective TFTs.

The TFTs fabricated in this manner are roughly classifiable into amorphous silicon TFTs and polysilicon TFTs according to the crystallinity of the silicon thin film to be used. The field effect mobility of a polysilicon film is usually higher than that of an amorphous silicon film. Thus, a polysilicon TFT can operate faster than an amorphous silicon TFT.

By adopting such high-speed-operating polysilicon TFTs, not just switching elements in the display area but also driver circuitry around the display area may consist of TFTs. However, if a source driver (data driver) and other peripheral driver circuits are made up of polysilicon TFTs, then variations will arise in the threshold voltage of the transistors and other TFT characteristics, thus posing a difficult problem in practice.

Meanwhile, a so-called "System on Glass" display system, in which not just peripheral driver circuits but also an image processor, a timing controller and other more sophisticated functional blocks are integrated together on the same substrate, has been extensively researched and developed recently to meet a high demand for that type of display systems.

However, even if just the source driver is additionally integrated, those variations in TFT characteristics are inevitable as described above. Thus, as can be easily expected, it is extremely difficult to integrate together controllers, DA converters and other functional circuits, which should exhibit even higher TFT performance, as a monolithic assembly on a high-strain-point non-alkaline glass substrate.

Also, to make TFTs for such a high-performance functional circuit, the performance of the TFTs needs to be further improved. However, there is a limit on the performance improvement of a polysilicon TFT. This is because a polysilicon film has localized states in gaps resulting from the imperfect crystallinity and defects around the crystal grain boundary, thus decreasing the mobility or increasing the S coefficient (sub-threshold coefficient). Consequently, even a polysilicon film cannot ensure sufficiently high transistor performance.

In view of these considerations, to further improve the performance of TFTs with the variations in their characteristics minimized, it was proposed that a single crystal silicon (single crystal silicon) film be used as an active layer (as a channel region) for the TFTs. A TFT of that type is called a "single crystal silicon TFT".

Japanese National Stage Publication No. 7-503557 and J. P. Salerno in "Single Crystal Silicon AMLCDs", Conference Record of the 1994 International Display Research Conference (IDRC), pp. 39-44, 1994 disclose the technique of fabricating a display panel for an active-matrix-addressed LCD by bonding single crystal silicon TFTs, which have been prepared in advance, onto a glass substrate with an adhesive.

However, according to the technique disclosed in Japanese National Stage Publication No. 7-503557, single crystal silicon TFTs, which are high-performance devices, are bonded onto a glass substrate with an adhesive, thus resulting in low yield and poor productivity. Also, after the single crystal silicon TFTs have been bonded onto the substrate, the substrate has bonding portions of the adhesive, and therefore, has low thermal resistance and easily emits gases. Thus, it is virtually impossible to further deposit a high-quality inorganic insulating film or a different group of TFTs on the substrate on which the single crystal silicon TFTs have been bonded.

On top of that, in making an active-matrix substrate using such single crystal silicon TFTs, a device including an array of single crystal silicon TFTs needs to be bonded onto another substrate. For that reason, there are some limits on sizes and costs.

Furthermore, Japanese National Stage Publication No. 7-503557 just discloses the technique of transferring prepared single crystal silicon TFTs onto a glass substrate. However, just by using those simply transferred single crystal silicon TFTs, it is impossible to obtain high-performance, high-function semiconductor devices that are in increasingly high demand these days.

Meanwhile, techniques of fabricating single crystal silicon TFTs on an insulating substrate without using adhesive are disclosed by Q. Y. Tong and U. Gesele, "SEMICONDUCTOR WAFER BONDING", SCIENCE AND TECHNOLOGY, John Wiley and Sons, New York, 1999. These documents describe a so-called "smart-Cut" (which is a SOITEC Corporation's trademark) method for bonding (or transferring) a single crystal silicon layer with hydrogen embrittlement.

In making an active-matrix substrate for use in an LCD, for example, not just single crystal silicon TFTs but also polysilicon TFTs are preferably integrated on the same substrate together. The applicant of the present application proposed in Japanese Patent Application No. 2003-67109 a method of making an active-matrix substrate in which single crystal silicon TFTs are fabricated on a substrate by utilizing the bonding method described above and then non-single crystal silicon TFTs (e.g., polysilicon TFTs) are fabricated on the same substrate.

Hereinafter, the method proposed in those patent applications will be described with reference to FIGS. 6A through 6H.

First, as shown in FIG. 6A, a substrate 30 with an insulating surface 31 is prepared. Meanwhile, hydrogen ions are implanted at a particular dose level into a single crystal silicon substrate 50 with a silicon dioxide layer 51 on the surface, thereby forming a hydrogen ion implanted layer 55 at a predetermined depth in the single crystal silicon substrate 50. In this process step, a single crystal silicon layer is produced between the hydrogen ion implanted layer 55 and the silicon dioxide layer 51 and will be referred to herein as an "upper single crystal silicon layer". Optionally, before hydrogen ions have been implanted, the upper single crystal silicon layer may be subjected to either a doping process to define a gate electrode or source/drain regions or a doping process to define a base, a collector and an emitter, thereby forming a thin-film transistor, the surface of which may subsequently be planarized and made hydrophilic. Next, the single crystal silicon substrate 50, in which the hydrogen ion implanted layer 55 has been produced, and the substrate 30 are bonded together such that the silicon dioxide layer 51 of the single crystal silicon substrate 50 is in contact with the insulating surface 31 of the substrate 30. Thereafter, these substrates 30 and 50 are heated to a temperature at which hydrogen ions dissociate themselves from silicon in the hydrogen ion implanted layer 55. As a result, the surface of the single crystal silicon substrate 50 (i.e., the silicon dioxide layer 51) and the insulating surface 31 can be bonded together even more strongly. In addition, micro bubbles are produced in the hydrogen ion implanted layer 55, thereby making the silicon dioxide layer 51 and upper single crystal silicon layer cleavable and removable at the hydrogen ion implanted layer 55 from the single crystal silicon substrate 50. In this manner, a bonded substrate 60, including the single crystal silicon layer 52 and MOS single crystal silicon TFTs, can be obtained without using adhesive as shown in FIG. 6C.

The bonded substrate 60 has a structure in which the surface portion of the single crystal silicon substrate 50 above the hydrogen ion implanted layer 55 (i.e., the upper single crystal silicon layer and the silicon dioxide layer 51) is bonded to the substrate 30. Thus, as shown in FIG. 6C, a big level difference is created between a portion of the bonded substrate 60, to which that surface portion has been bonded (i.e., bonding portion), and the other portions thereof. This level difference is greater than the thickness of the silicon dioxide layer 51 (which is normally in the range of about 100 nm to about 500 nm).

The process steps of fabricating a device, including non-single crystal silicon, on such a substrate 60 will be described as an example.

First, as shown in FIG. 6D, an insulating film 56 of $SiO_2$, for example, and an amorphous silicon film 57 are deposited in this order over the entire surface of the substrate 60. Next, as shown in FIG. 6E, the amorphous silicon film 57 is crystallized into a polysilicon film 57p. Subsequently, as shown in FIG. 6F, the polysilicon film 57p is patterned into a patterned polysilicon layer 57', which is then covered with a gate insulating film 58 of $SiO_2$. Thereafter, a conductor film (not shown) is deposited on the gate insulating film 58 and then etched into the pattern of gate electrodes 59.

Subsequently, as shown in FIG. 6G, the surface of the substrate 60 is further covered with a passivation film and an interlayer dielectric film 62. Thereafter, as shown in FIG. 6H, metal interconnects 61 are defined on the interlayer dielectric film 62 so as to be electrically connected to the polysilicon layer 57' and single crystal silicon layer 52 through contact holes that have been provided through the interlayer dielectric film 62 and so on. In this manner, single crystal silicon TFTs and polysilicon TFTs can be fabricated on the same substrate.

According to this method, however, the following problems may arise due to the significant level difference between the bonding portion on the surface of the bonded substrate 60 and the other portions.

The gate electrodes 59 are usually defined by patterning the conductor film (not shown), which has been deposited on the gate insulating film 58, by a dry etching process (see FIG. 6F). In this process step, there are some deep stepped portions 70 on the surface of the substrate 60. Accordingly, some residues of the conductor film may remain on the side surface of those stepped portions 70. Also, if interconnects are defined so as to cross the stepped portions 70, then the interconnects are more likely to disconnect.

As described above, if single crystal silicon devices are fabricated on a substrate by a transfer technique, for example, and then non-single crystal silicon devices are further fabricated on the same substrate, then fine-line interconnects may disconnect or some conductor may be left on the stepped surface portions of the substrate even after the dry etching process, thus possibly affecting the reliability and the yield of the resultant device.

SUMMARY OF THE INVENTION

In order to overcome the problems described above, an object of the present invention is to reduce the level difference to be created on the surface of a substrate when a single crystal semiconductor layer is bonded onto the substrate.

A semiconductor device according to a preferred embodiment of the present invention preferably includes a substrate with an insulating surface and a single crystal semiconductor layer, which is bonded to the insulating surface of the substrate. The device preferably further includes a first insulating layer, which is provided between the insulating surface of the substrate and the single crystal semiconductor layer, and a second insulating layer, which has been deposited on the entire insulating surface of the substrate except an area in which the first insulating layer is present.

In one preferred embodiment of the present invention, every edge of the second insulating layer is preferably aligned with its associated edge of the first insulating layer.

In another preferred embodiment, the thickness of the first insulating layer is preferably substantially equal to that of the second insulating layer.

In still another preferred embodiment, the semiconductor device preferably further includes a non-single crystal semiconductor layer on the second insulating layer.

An electronic device including semiconductor devices according to a preferred embodiment of the present invention preferably includes: a substrate with an insulating surface; a single crystal semiconductor layer, which is bonded onto a selected area of the insulating surface of the substrate; a first insulating layer, which is provided between the insulating surface of the substrate and the single crystal semiconductor layer; a second insulating layer, which has been deposited on the entire insulating surface except the selected area where the first insulating layer is present; a single crystal semiconductor device, which has been fabricated over the first insulating layer so as to include at least a portion of the single crystal semiconductor layer; and a non-single crystal semiconductor device, which has been fabricated on the second insulating layer.

In one preferred embodiment of the present invention, every edge of the second insulating layer is preferably aligned with its associated edge of the first insulating layer.

In another preferred embodiment, the thickness of the first insulating layer is preferably substantially equal to that of the second insulating layer.

In still another preferred embodiment, the non-single crystal semiconductor device includes at least a portion of a non-single crystal semiconductor layer provided on the second insulating layer.

In yet another preferred embodiment, the single crystal semiconductor device is preferably a thin-film transistor, which includes at least the portion of the single crystal semiconductor layer as a channel region, and the non-single crystal semiconductor device is preferably a thin-film transistor, which includes at least the portion of the non-single crystal semiconductor layer as a channel region.

In this particular preferred embodiment, the electronic device preferably further includes a third insulating layer, which is located between the second insulating layer and the non-single crystal semiconductor layer and between the single crystal semiconductor layer and the non-single crystal semiconductor layer. The single crystal semiconductor device preferably further includes a gate electrode on the third insulating layer. The non-single crystal semiconductor device preferably further includes a gate insulating film, which covers the non-single crystal semiconductor layer, and a gate electrode on the gate insulating film. The third insulating layer is preferably thinner than the gate insulating film of the non-single crystal semiconductor device.

In yet another preferred embodiment, the gate electrode of the single crystal semiconductor device and a channel region of the non-single crystal semiconductor device may be made of the same polycrystalline semiconductor film.

A method for fabricating a semiconductor device according to a preferred embodiment of the present invention preferably includes the steps of (a) preparing a single crystal semiconductor substrate that includes: a first insulating layer, which covers the surface of the substrate; an ion implanted layer, which is located at a predetermined depth as measured from the surface and which includes hydrogen ions and/or ions of a rare gas; and a single crystal semiconductor layer, which is located between the first insulating layer and the ion implanted layer, (b) preparing a supporting substrate with an insulating surface, (c) bonding the single crystal semiconductor substrate onto a selected area of the insulating surface of the supporting substrate such that the first insulating layer contacts with the insulating surface of the supporting substrate, (d) depositing a second insulating layer over the supporting substrate such that the single crystal semiconductor substrate is covered with the second insulating layer, and (e) removing a portion of the second insulating layer, which covers the single crystal semiconductor substrate, and a portion of the single crystal semiconductor substrate itself from the supporting substrate with the first insulating layer and the single crystal semiconductor layer left on the supporting substrate.

In one preferred embodiment of the present invention, the step (d) preferably includes depositing the second insulating layer such that the thickness of the second insulating layer becomes substantially equal to, or greater than, that of the first insulating layer.

In another preferred embodiment, the step (d) includes depositing the second insulating layer at a temperature of 350° C. or less.

In still another preferred embodiment, the step (e) preferably includes heating the single crystal semiconductor substrate to a temperature of 400° C. to 650° C., thereby separating the single crystal semiconductor layer from the single crystal semiconductor substrate.

In yet another preferred embodiment, the method may further include, after the step (e), the step of (f) selectively etching, and reducing the thicknesses of, the second insulating layer and the single crystal semiconductor layer, thereby substantially equalizing the thickness of the second insulating layer with that of the first insulating layer.

In yet another preferred embodiment, the method may further include the step of (d2) depositing an amorphous semiconductor film on the second insulating layer after the step (d) and before the step (e).

In this particular preferred embodiment, the step (e) preferably includes removing hydrogen atoms from the amorphous semiconductor film while separating the single crystal semiconductor layer from the single crystal semiconductor substrate.

A method for fabricating an electronic device including semiconductor devices according to a preferred embodiment of the present invention preferably includes the steps of (a) preparing a single crystal semiconductor substrate that includes: a first insulating layer, which covers the surface of the substrate; an ion implanted layer, which is located at a predetermined depth as measured from the surface and which includes hydrogen ions and/or ions of a rare gas; and a single crystal semiconductor layer, which is located between the first insulating layer and the ion implanted layer, (b) preparing a supporting substrate with an insulating surface, (c) bonding the single crystal semiconductor substrate onto a selected area of the insulating surface of the supporting substrate such that the first insulating layer contacts with the insulating surface of the supporting substrate, (d) depositing a second insulating layer over the supporting substrate such that the single crystal semiconductor substrate is covered with the second insulating layer, (e) removing a portion of the second insulating layer, which covers the single crystal semiconductor substrate, and a portion of the single crystal semiconductor substrate itself from the supporting substrate with the first insulating layer and the single crystal semiconductor layer left on the supporting substrate, thereby forming a semiconductor device in which the first insulating layer and the single crystal semiconductor layer are provided on the selected area of the insulating surface of the supporting substrate and in which the second insulating layer has been deposited on the entire insulating surface of the supporting substrate except the selected area where the first insulating layer is present, and (f) making a single crystal semiconductor device over the first insulating layer of the semiconductor device such that the single crystal semiconductor device includes at least a portion of the single crystal semiconductor layer and also making a non-single crystal semiconductor device on the second insulating layer of the semiconductor device.

In one preferred embodiment of the present invention, the method preferably further includes the step of (d2) depositing an amorphous semiconductor film on the second insulating layer after the step (d) and before the step (e).

In another preferred embodiment, the method preferably further includes, between the steps (e) and (f), the steps of (g) forming a third insulating layer on the single crystal semiconductor layer and on the second insulating layer, and (h) depositing an amorphous semiconductor film on the third insulating layer.

In still another preferred embodiment, the step (f) may include the steps of (f2) crystallizing and turning the amorphous semiconductor film into a polycrystalline semiconductor film and (f3) patterning the polycrystalline semiconductor film.

In yet another preferred embodiment, the step (f) may include making thin-film transistors as the single crystal semiconductor device and the non-single crystal semiconductor device.

In yet another preferred embodiment, the step (a) may include preparing a single crystal semiconductor substrate in which multiple transistor structures, which use at least a portion of the single crystal semiconductor layer between the ion implanted layer and the first insulating layer as a channel region, have been defined at least partially.

In yet another preferred embodiment, the step (f) may include the steps of (f2) crystallizing and turning the amorphous semiconductor film into a polycrystalline semiconductor film, and (f3) patterning the polycrystalline semiconductor film. The non-single crystal semiconductor device may be a thin-film transistor, which uses at least a portion of the polycrystalline semiconductor film as a channel region, and the single crystal semiconductor device may be a thin-film transistor, which uses at least another portion of the polycrystalline semiconductor film as a gate electrode.

In yet another preferred embodiment, the step (f) may include making thin-film transistors as the single crystal semiconductor device and as the non-single crystal semiconductor device. The step (f) may include the steps of (f2') providing a gate electrode for the single crystal semiconductor device on the third insulating layer, (f2) crystallizing and turning the amorphous semiconductor film into a polycrystalline semiconductor film, (f3) patterning the polycrystalline semiconductor film, (f4) forming a gate insulating film that covers the patterned polycrystalline semiconductor film, and (f5) providing a gate electrode for the non-single crystal semiconductor device on the gate insulating film. The step (g) may include forming the third insulating layer that is thinner than the gate insulating film formed by the step (f4).

A semiconductor device according to a preferred embodiment of the present invention preferably includes a substrate having an $SiO_2$ film on the surface; and a single crystal silicon layer, which is bonded to a surface of the $SiO_2$ film. The device preferable further includes a first $SiO_2$ layer, which is provided between the surface of the $SiO_2$ film and the single crystal silicon layer, and a second $SiO_2$ layer, which has been deposited on the entire surface of the $SiO_2$ film except an area in which the first $SiO_2$ layer is present.

According to various preferred embodiments of the present invention described above, the level difference to be created on the surface of a substrate by bonding a single crystal semiconductor layer thereto can be reduced significantly as compared with a conventional one. In addition, a high-reliability electronic device, including a single crystal semiconductor device and a non-single crystal semiconductor device on the same substrate, can be provided. By integrating the single crystal and non-single crystal semiconductor devices together on the same substrate, a system with even higher performance is realized.

Other features, elements, processes, steps, characteristics and advantages of the present invention will become More apparent from the following detailed description of preferred embodiments of the present invention with reference to the attached drawings.

BRIEF DESCRIPTION OF THE DRAWINGS

FIGS. 3A through 3I are cross-sectional views illustrating respective process steps for fabricating a semiconductor device according to a second preferred embodiment of the present invention.

FIGS. 4A through 4H are cross-sectional views illustrating respective process steps for fabricating a semiconductor device according to a third preferred embodiment of the present invention.

FIGS. 5A through 5H are cross-sectional views illustrating respective process steps for fabricating a semiconductor device according to a fourth preferred embodiment of the present invention.

FIGS. 6A through 6H are cross-sectional views illustrating a conventional method for fabricating a semiconductor device.

DETAILED DESCRIPTION OF PREFERRED EMBODIMENTS

According to a preferred embodiment of the present invention, after a single crystal semiconductor substrate has been bonded onto a supporting substrate with an insulating surface (e.g., a glass substrate) and before a bulk portion of that single crystal semiconductor substrate is removed from the supporting substrate, an insulating film is deposited over the supporting substrate. And when the bulk portion of the single crystal semiconductor substrate is removed from the supporting substrate, excessive portions of that insulating film are also removed by a lift-off technique. By adopting this lift-off technique, no matter what shape the single crystal semiconductor substrate has, the excessive portions of the insulating film to be removed have the same shape as the single crystal semiconductor substrate. As a result, the insulating film remaining on the supporting substrate is self-aligned with the single crystal semiconductor layer that has been bonded onto the supporting substrate.

Hereinafter, a preferred embodiment of the present invention will be described in further detail with reference to FIGS. 1A through 1F.

Figure 1A:
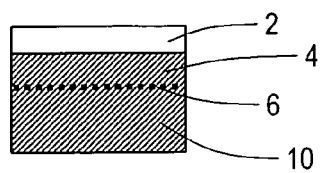
FIGS. 1A through 1F are schematic cross-sectional views showing how to make a semiconductor device according to a principle of the present invention.

First, as shown in FIG. 1A, a single crystal semiconductor substrate, including an ion implanted layer 6, is prepared. The ion implanted layer 6 has been produced in advance by implanting hydrogen ions and/or ions of a rare gas to a predetermined depth as measured from the surface. A first insulating layer 2 has also been defined on the surface of this single crystal semiconductor substrate. In the single crystal semiconductor substrate, the portion located between the first insulating layer 2 and the ion implanted layer 6 is a single crystal semiconductor layer 4, while the other portion located between the ion implanted layer 6 and the lower surface of the single crystal semiconductor substrate is a bulk portion 10.

Figure 1B:
Figure 1C:
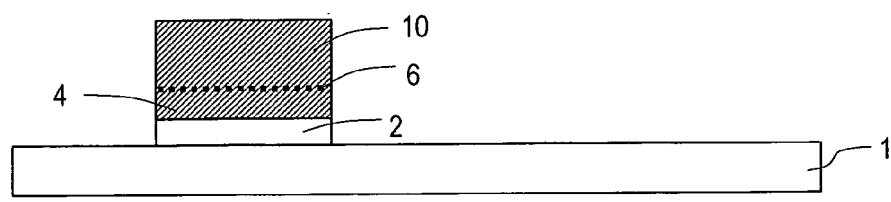

Next, as shown in FIG. 1B, a supporting substrate 1 with an insulating surface 12 is prepared. Thereafter, as shown in FIG. 1C, the single crystal semiconductor substrate is bonded onto the supporting substrate 1 such that the first insulating layer 2 of the single crystal semiconductor substrate contacts with a selected area on the insulating surface 12.

Figure 1D:
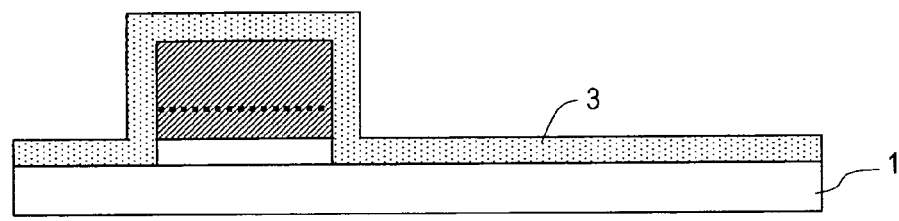

Subsequently, as shown in FIG. 1D, a second insulating layer 3 is deposited all over the exposed surface of the substrate 1 to which the single crystal semiconductor substrate has been bonded. The deposition temperature of the second insulating layer 3 is preferably lower than the temperature at which hydrogen ions dissociate themselves from the ion implanted layer 6 of the single crystal semiconductor substrate.

Figure 1E:
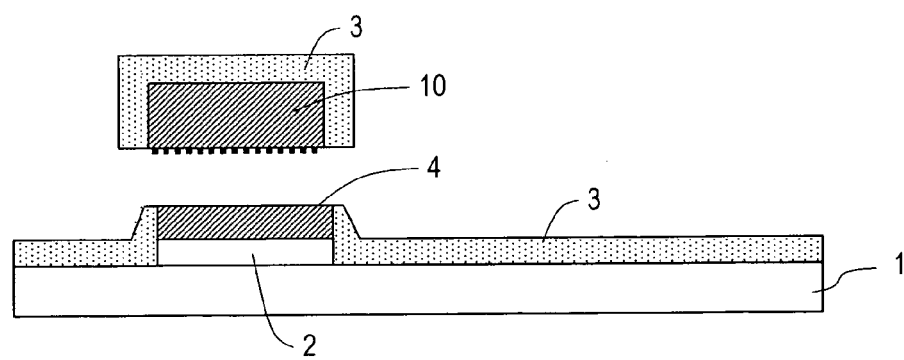
Figure 1F:
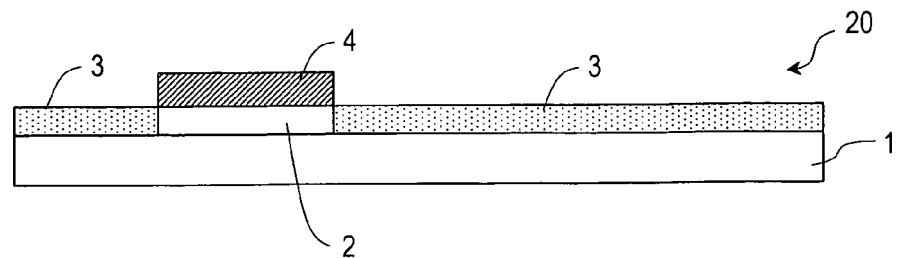

Thereafter, the substrate 1 is annealed at a predetermined temperature, thereby splitting the single crystal semiconductor substrate into two along the ion implanted layer 6 as shown in FIG. 1E. The annealing temperature is typically at least 400° C. and is preferably 500° C. or more. Also, considering the thermal resistance of the substrate 1, the annealing temperature is preferably at most 650° C. and more preferably 600° C. or less. As a result of this process step, not only the bulk portion 10 of the single crystal semiconductor substrate is separated from the supporting substrate 1 but also excessive portions of the second insulating layer 3, which have covered the upper and side surfaces of the bulk portion 10, are lifted off. Consequently, the second insulating layer 3 covers only surface areas of the substrate 1 where the first insulating layer 2 is not present. Thereafter, if necessary, surface portions of the second insulating layer 3 may be etched away from around the edges of the single crystal semiconductor layer 4, thereby planarizing the surface of the second insulating layer 3 as shown in FIG. 1F.

In this manner, a bonded substrate 20, in which the single crystal semiconductor layer 4 has been bonded onto the supporting substrate 1, can be obtained. In this bonded substrate 20, the second insulating layer 3 is provided on the surface of the substrate 1 so as to be self-aligned with the first insulating layer 2 (i.e., so as not to overlap with the first insulating layer 2). That is, the edge of the second insulating layer 3 makes contact with its associated edge of the first insulating layer 2. Thus, a smaller level difference is created by bonding the single crystal semiconductor layer 4.

As used herein, a structure including just a substrate with an insulating surface and a single crystal semiconductor layer that has been formed on that surface is sometimes referred to as a "semiconductor device". Thus, the bonded substrate 20 including the single crystal semiconductor layer 4 as shown in FIG. 1F may also be referred to herein as a "semiconductor device". Also, the "substrate with an insulating surface" in a semiconductor device is typically an insulating substrate of glass but does not always have to have a plate shape.

To reduce the level difference, the thickness of the first insulating layer 2 is preferably approximately equal to that of the second insulating layer 3. However, even if these insulating layers 2 and 3 have different thicknesses, the level difference can still be reduced sufficiently effectively. Furthermore, even if the second insulating layer 3 is far thicker than the first insulating layer 2 before the single crystal semiconductor substrate is removed from the supporting substrate 1, the final thickness of the second insulating layer 3 can also be adjusted by etching the portions of the second insulating layer 3 remaining on the supporting substrate 1. The final thickness of the second insulating layer 3 is preferably defined such that the absolute value of the difference in thickness (i.e., the level difference) between the first and second insulating layers 2 and 3 is at most about 100 nm, more preferably about 50 nm or less.

In making TFTs on the bonded substrate 20 shown in FIG. 1F, single crystal semiconductor TFTs can be fabricated by using the single crystal semiconductor layer 4 that has been bonded onto the supporting substrate 1. Also, if a non-single crystal semiconductor layer is deposited on the second insulating layer 3, then single crystal semiconductor TFTs and non-single crystal semiconductor TFTs can be integrated together on the same substrate 1. Even if a circuit is made of the single crystal and non-single crystal layers on the same substrate in this manner, the level difference on the substrate surface can be reduced significantly at least, and may even be eliminated in some cases, according to the present invention. Thus, a highly reliable semiconductor device can be provided with the disconnection or short-circuit of the interconnects minimized.

The bonded substrate 20 is applicable for use in various electronic devices with semiconductor devices. As used herein, the "electronic device including semiconductor devices" broadly refers to any electronic device including at least two semiconductor devices, e.g., an active-matrix substrate, an LCD, an organic EL display, an LSI, and so forth. For example, such an electronic device including semiconductor devices may be an active-matrix substrate that includes a single crystal silicon TFT on the first insulating layer 2 and a polysilicon TFT on the second insulating layer 3. The single crystal silicon TFT may use at least a portion of the single crystal semiconductor layer (single crystal silicon layer) 4 as its channel region. On the other hand, the polysilicon TFT may use a polysilicon layer on the second insulating layer 3 as its channel region. Furthermore, the gate electrode of the single crystal silicon TFT and the channel region of the non-single crystal silicon TFT may be made of the same polycrystalline semiconductor film.

Embodiment 1

Hereinafter, a first specific preferred embodiment of the present invention will be described with reference to FIGS. 2A through 2H.

Figure 2A:
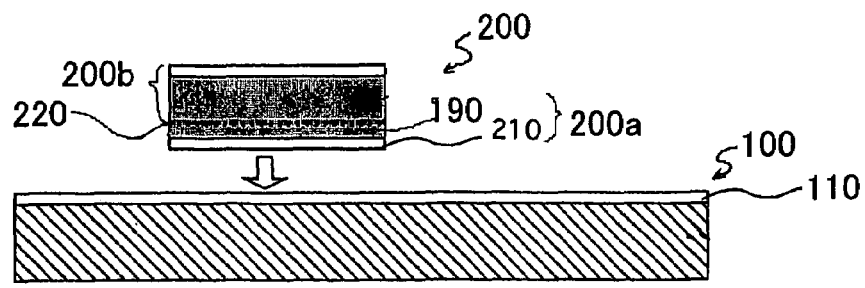
FIGS. 2A through 2H are cross-sectional views illustrating respective process steps for fabricating a semiconductor device according to a first preferred embodiment of the present invention.

First, as shown in FIG. 2A, a supporting substrate 100 and a single crystal silicon substrate 200 are prepared. Although only one single crystal silicon substrate 200 is illustrated in FIG. 2A, the number of single crystal silicon substrates 200 to be bonded onto the single supporting substrate 100 does not have to be one but may be two or more.

In this preferred embodiment, the supporting substrate 100 is a glass substrate Code 1737 (produced by Corning Inc.) on which an $SiO_2$ film 110 has been deposited to a thickness of about 100 nm. This $SiO_2$ film 110 may be deposited by a plasma CVD process using tetraethylorthosilicate (TEOS) and oxygen gases. The $SiO_2$ film 110 may be omitted depending on the material of the substrate. For example, when the glass substrate Code 1737 is used, it is not always necessary to deposit an insulating film on its surface. It should be noted that the supporting substrate 100 has only to have an insulating surface and not the overall supporting substrate 100 has to be made of an electrically insulating material.

Next, it will be described how to make the single crystal silicon substrate 200 according to this preferred embodiment.

First, a first $SiO_2$ film 210 is deposited to a thickness of 50 nm to 100 nm, for example, on the surface of a single crystal silicon wafer. In this preferred embodiment, the first $SiO_2$ film 210 has a thickness of about 100 nm. However, if the supporting substrate 100 has no insulating film 110, then the first $SiO_2$ film 210 of the single crystal silicon substrate 200 is preferably relatively thick (e.g., in the range of 200 nm to 300 nm) to stabilize the characteristics.

Next, a hydrogen ion implanted layer 220 is formed at a predetermined depth in the single crystal silicon wafer. In this process step, the thickness of the single crystal silicon layer to be bonded onto the supporting substrate can be defined by the depth of the hydrogen ion implanted layer 220 produced. The hydrogen ion implanted layer 220 may be located at a depth of about 500 nm, for example. The hydrogen ion implanted layer 220 may be formed by implanting hydrogen ions at a predetermined dose (e.g., $5 \times 10^{16}/cm^2$). Optionally, not only the hydrogen ions but also ions of a rare gas may be implanted as well. By implanting the hydrogen ions and the ions of a rare gas in combination, the hydrogen ions need to be implanted in a reduced dose to cleave and separate the bulk of the single crystal silicon substrate 200. And when the implant dose of hydrogen ions decreases, complex defects to be generated through hydrogen-acceptor bonding can be minimized and the deterioration in device performance due to the hydrogen implantation can be avoided. Since the rare gas ions have a greater mass than the hydrogen ions, the implantation of the rare gas ions causes a greater damage on the silicon wafer than the implantation of the hydrogen ions. Thus, the implant doses need to be appropriately determined according to the device performance required. In this preferred embodiment, hydrogen ions and He ions are implanted into the silicon wafer at an implant dose of $1 \times 10^{16}$/cm$^2$ and at an implant dose of $3 \times 10^{16}$/cm$^2$ respectively.

Subsequently, the silicon wafer prepared in this manner is cut into at least one single crystal silicon substrate 200 with a predetermined size and shape. The size and shape of the single crystal silicon substrate 200 are determined according to the size and shape of the single crystal semiconductor layer to be bonded onto the supporting substrate 100. If the single crystal silicon substrate 200 has a relatively small size, then the single silicon wafer may be diced into a plurality of single crystal silicon substrates 200. Also, if a lot of single crystal silicon substrates 200 are bonded onto the same supporting substrate 100, those single crystal silicon substrates 200 may have been cut out of respectively different silicon wafers.

In the single crystal silicon substrate 200, the portion between the hydrogen ion implanted layer 220 and the first SiO$_2$ film 210 will be referred to herein as a single crystal silicon layer 190, while the other portion deeper than the hydrogen ion implanted layer 220 will be referred to herein as a bulk portion 200b. The single crystal silicon layer 190 and the first SiO$_2$ film 210 will be collectively referred to herein as a "surface region 200a".

Thereafter, the surfaces of the supporting substrate 100 and single crystal silicon substrate 200 are ultrasonic cleaned (may even be megasonic cleaned) in an SC-1 solution (i.e., a mixture of ammonia, hydrogen peroxide and deionized water) and then rinsed with ultrapure water, thereby removing foreign particles from the surfaces and activating the surfaces of these substrates.

Figure 2B:
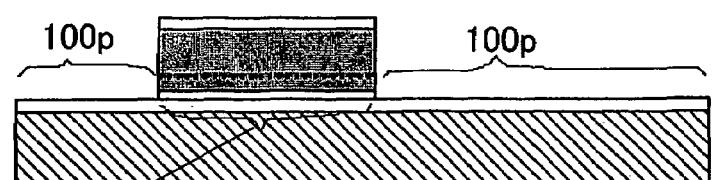

Subsequently, as shown in FIG. 2B, the single crystal silicon substrate 200 and the supporting substrate 100 are bonded together in a predetermined area 100s at room temperature, thereby obtaining a bonded substrate. In this process step, these substrates 200 and 100 are bonded together such that the insulating film 110 of the supporting substrate 100 contacts with the first SiO$_2$ film 210 of the single crystal silicon substrate 200.

On the surface of the supporting substrate 100, the area 100s to which the single crystal silicon substrate 200 has been bonded will be referred to herein as a "single crystal semiconductor device area 100s", while the other area will be referred to herein as a "non-single crystal-semiconductor device area 100p".

Figure 2C:
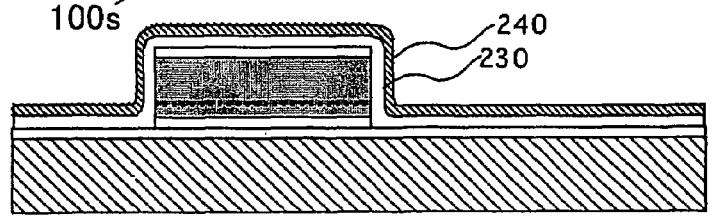

Next, as shown in FIG. 2C, a second SiO$_2$ film 230 and an a-Si film 240 are deposited in this order to thicknesses of about 100 nm and about 50 nm, respectively, by a plasma CVD process, for example, so as to cover the entire exposed surface of the bonded substrate. In depositing these films 230 and 240, the temperature of the bonded substrate is preferably maintained at least equal to 250° C. but at most equal to the hydrogen dissociation temperature (e.g., equal to or lower than 350° C.). As a result, without allowing the bulk portion 200b to cleave or separate from the single crystal silicon substrate 200, some of the hydrogen bonds can be turned into stronger Si—O—Si bonds at the interface between the supporting substrate 100 and the single crystal silicon substrate 200. As a result, the bond strength can be increased. Also, the thickness of the second SiO$_2$ film 230 is preferably approximately equal to that of the first SiO$_2$ film 210.

Figure 2D:
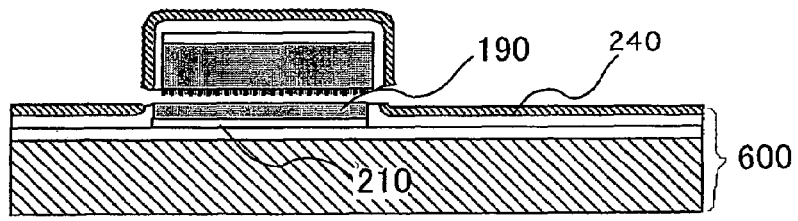

Thereafter, the bonded substrate is preferably annealed at a temperature of at least about 400° C., more preferably at a temperature of 500° C. to 600° C. As a result of this heat treatment, hydrogen atoms dissociate themselves from the a-Si film 240 and the single crystal silicon substrate 200 splits along the hydrogen ion implanted layer 220. That is to say, the bulk portion 200b of the single crystal silicon substrate 200 comes off the bonded substrate. At the same time, portions of the second SiO$_2$ film 230 and a-Si film 240, which have covered the exposed lower and side surfaces of the single crystal silicon substrate 200, are also lifted off. Consequently, as shown in FIG. 2D, the surface region 200a of the single crystal silicon substrate 200 (i.e., the first SiO$_2$ film 210 and the single crystal silicon layer 190) remains in the single crystal semiconductor device area 100s of the supporting substrate 100, while the second SiO$_2$ film 230 (with a thickness of 100 nm, for example) and the a-Si (or already polycrystalline) film 240 (with a thickness of 50 nm, for example) are left in the non-single crystal semiconductor device area 100p.

Figure 2E:
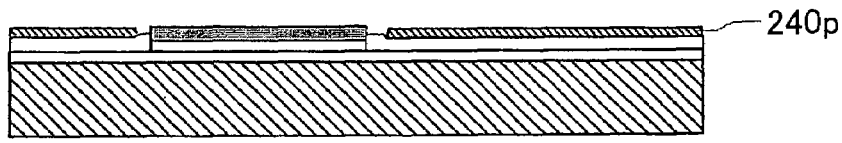

In this manner, the bonded substrate 600 shown in FIG. 2E is obtained. In this preferred embodiment, the thickness of the second SiO$_2$ film 230 is approximately equal to that of the first SiO$_2$ film 210. Thus, these insulating films 230 and 210 together make up a single insulating layer that has a substantially flat surface over the bonded substrate 600.

Optionally, the thickness of the second SiO$_2$ film 230 may be different from that of the first SiO$_2$ film 210. However, the absolute value of that difference is preferably at most equal to 100 nm, more preferably 50 nm or less. Then, the level difference between the areas 100s and 100p on the surface of the substrate can be reduced to 100 nm or less, preferably 50 nm or less.

According to this fabricating method, the second SiO$_2$ film 230 can be defined in the area 100p, other than the area 100s where the single crystal silicon layer 190 has been bonded, so as to be self-aligned with the single crystal silicon layer 190. Thus, the level difference between the surface areas 100s and 100p on the substrate can be reduced without complicating the manufacturing process. As a result, high-reliability single crystal Si devices and non-single crystal Si devices can be integrated together on the same substrate 600. Also, according to this preferred embodiment, a non-single crystal silicon device can be fabricated easily on the second SiO$_2$ film 230 by using the a-Si film 240. In that case, a single crystal silicon device (e.g., a single crystal silicon TFT) and a non-single crystal silicon device (e.g., a non-single crystal silicon TFT) are preferably fabricated simultaneously, because the level difference between the single crystal silicon layer 190 and the a-Si film 240 will be small enough to further simplify the manufacturing process and increase the yield then. For example, by fabricating a single crystal silicon TFT and a polysilicon TFT on the same substrate 600, an active-matrix substrate can be made.

Hereinafter, an exemplary method for making an active-matrix substrate with the substrate 600 will be described.

First, the a-Si film 240 is crystallized (with a laser beam, for example) and turned into a p-Si film 240p. The hydrogen atoms that were contained in the a-Si film 240 have already been removed by the annealing process (FIG. 2D). For that reason, in this crystallizing process step, it is possible to prevent the p-Si film 240p from being ruptured due to rapid expansion or dissociation of those hydrogen atoms. This crystallizing process step may be carried out by exposing the overall substrate 600 to an excimer laser beam (such as an XeCl laser beam with a wavelength of 308 nm) at an energy density of 300 to 400 mJ/cm², for example. Alternatively, the a-Si film 240 may also be crystallized by annealing the substrate 600 in a furnace. In any case, the single crystal silicon layer 190 is preferably sufficiently thick. This is because in such a rather thick single crystal silicon layer 190, its surface melts but the inside portion thereof does not. More particularly, the single crystal silicon layer 190 preferably has a thickness of at least 300 nm, more preferably 500 nm or more (e.g., about 500 nm). In addition, by performing any of these crystallizing process steps, crystal defects and other defects, which were created in the single crystal silicon layer 190 due to the implantation of hydrogen ions, can be repaired sufficiently.

Subsequently, as shown in FIG. 2E, portions of the second $SiO_2$ film 230, which are exposed around the single crystal silicon layer 190, are selectively etched away by a reactive ion etching (RIE) process, which is a kind of anisotropic etching process. In this preferred embodiment, those exposed portions of the second $SiO_2$ film 230 are selectively removed to a depth corresponding with the thickness of the p-Si film 240p (e.g., about 50 nm) by an RIE process using a mixture of $CHF_3$, $CF_4$ and Ar gases.

Next, with the p-Si film 240p masked with a photoresist, the single crystal silicon layer 190 is etched so as to have a predetermined thickness. This etching process may be carried out as an RIE process using a mixture of $Cl_2$, HBr, He and $O_2$ gases, for example. As a result, hydrogen atoms and defects that have been produced due to the cleavage or separation can be removed from around the surface of the single crystal silicon layer 190. The present inventors confirmed via experiments that to remove those hydrogen atoms or defects sufficiently, the single crystal silicon layer 190 needs to be etched to at least 150 nm, preferably 200 nm or more. In this preferred embodiment, the single crystal silicon layer 190 is etched to a depth of about 400 nm as measured from the surface.

Figure 2F:
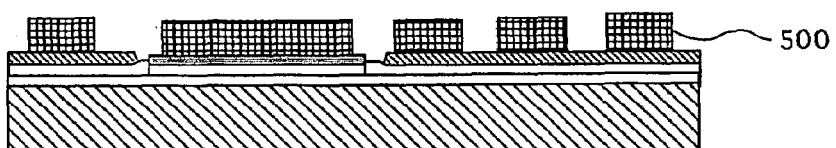

Thereafter, as shown in FIG. 2F, a photoresist pattern 500 with a predetermined shape is defined on the single crystal silicon layer 190 and p-Si film 240p by a photolithographic process.

Figure 2G:
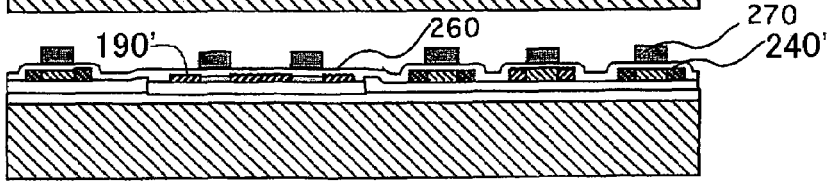
Figure 2H:
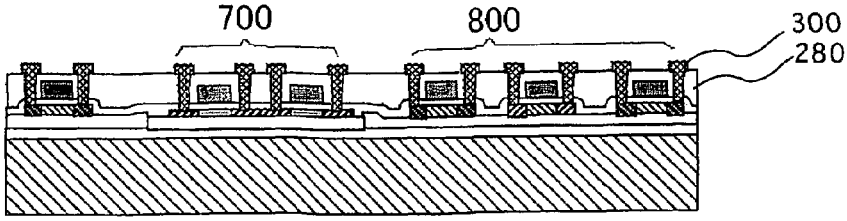

Then, as shown in FIG. 2G, the p-Si film 240p and the single crystal silicon layer 190 are patterned into island shapes by an RIE process, thereby making a p-Si semiconductor layer 240' and a single crystal Si semiconductor layer 190'. In the example illustrated in FIG. 2G, the single crystal silicon layer 190 is patterned into one island-like single crystal Si semiconductor layer 190' on which just two transistors are fabricated for the sake of simplicity. Actually, however, the number of transistors fabricated is not limited to two but a lot more transistors are formed there.

Thereafter, a gate oxide film 260 is deposited over the p-Si semiconductor layer 240' and single crystal silicon semiconductor layer 190'. Finally, gate electrodes 270 are formed for respective transistors, dopant ions are implanted into the semiconductor layers 240' and 190', an interlayer dielectric film 280 is deposited over the substrate, contact holes are opened through it, and metal interconnects 300 are provided to fill those holes, all of which process steps may be performed by well known methods. Consequently, a single crystal silicon TFT 700 and a polysilicon TFT 800 can be fabricated on the same substrate.

According to this method, a single crystal silicon TFT and a polysilicon TFT can be fabricated efficiently on the same substrate 600. Among other things, an amorphous silicon film is preferably provided before an annealing process is carried out to separate the bulk portion of the single crystal silicon substrate. This is because by performing the annealing process, not just can the single crystal silicon substrate be separated but also can hydrogen atoms be removed from the amorphous silicon film then. Consequently, without separately providing an additional process step of removing hydrogen atoms from the amorphous silicon film, it is possible to prevent the amorphous silicon film from being ruptured due to too rapid expansion or dissociation of those hydrogen atoms while the amorphous silicon film is being crystallized with a laser beam.

It should be noted that the semiconductor device including the single crystal silicon layer does not have to be the single crystal silicon TFT. Likewise, the semiconductor device including the non-single crystal silicon layer is not limited to the polysilicon TFT, either, but may also be any other polysilicon or amorphous silicon device. Also, in the preferred embodiment described above, the first insulating layer provided in the single crystal semiconductor device area 100s and the second insulating layer provided in the non-single crystal semiconductor device area 100p are both supposed to be $SiO_2$ films.

Embodiment 2

Hereinafter, a second specific preferred embodiment of the present invention will be described with reference to FIGS. 3A through 3I.

First, as shown in FIG. 3A, a supporting substrate 100 and a single crystal silicon substrate 200 are prepared. Each of the supporting substrate 100 and single crystal silicon substrate 200 may have the same configuration as, and may be prepared by the same method as, the counterpart that has already been described for the first preferred embodiment with reference to FIG. 2A. In FIG. 3A, the first $SiO_2$ film 210 of the single crystal silicon substrate 200 is illustrated as if the film 210 were thinner than the first $SiO_2$ film 210 shown in FIG. 2A. Actually, however, these two films have approximately equal thicknesses. In this manner, the thicknesses and sizes of respective layers are not always to scale in not only FIG. 3A but also the other drawings as well. Thus, the present invention is in no way limited to the configurations illustrated in those drawings.

Subsequently, by the same method as that already described with reference to FIG. 2B, the single crystal silicon substrate 200 and the supporting substrate 100 are bonded together in a predetermined area 100s (i.e., single crystal semiconductor device area) at room temperature, thereby obtaining a bonded substrate as shown in FIG. 3B.

Next, as shown in FIG. 3C, a second $SiO_2$ film 230 is deposited to a thickness of about 100 nm by a plasma CVD process so as to cover the entire exposed surface of the bonded substrate. In depositing the second $SiO_2$ film 236, the temperature of the bonded substrate is preferably maintained at least equal to 150° C. but at most equal to the hydrogen dissociation temperature (e.g., equal to or lower than 350° C.). As a result, without allowing the bulk portion 200b to cleave or separate from the single crystal silicon substrate 200, some of the hydrogen bonds can be turned into stronger Si—O—Si bonds at the interface between the supporting substrate 100 and the single crystal silicon substrate 200. As a result, the bond strength can be increased.

Thereafter, the bonded substrate is preferably annealed at a temperature of at least about 400° C., more preferably at a temperature of 500° C. to 600° C. As a result of this heat treatment, the single crystal silicon substrate 200 splits along the hydrogen ion implanted layer 220. That is to say, the bulk portion 200*b* of the single crystal silicon substrate 200 comes off the bonded substrate. At the same time, portions of the second SiO$_2$ film 230, which have covered the exposed lower and side surfaces of the single crystal silicon substrate 200, are also lifted off. Consequently, as shown in FIG. 3D, the surface region 200*a* of the single crystal silicon substrate 200 (i.e., the first SiO$_2$ film 210 with a thickness of 100 nm, for example, and the single crystal silicon layer 190 with a thickness of 400 nm, for example) remains in the single crystal semiconductor device area 100*s* of the supporting substrate 100, while the second SiO$_2$ film 230 (with a thickness of 100 to 150 nm, for example) is left in the non-single crystal semiconductor device area 100*p*.

Subsequently, surface portions of the second SiO$_2$ film 230 and single crystal silicon layer 190 are sequentially removed by a reactive ion etching (RIE) process, which is a kind of anisotropic etching process. Alternatively, the surface portions of the second SiO$_2$ film 230 and single crystal silicon layer 190 may also be removed at the same time by adjusting the compositions of gases such that their etch rates become substantially equal to each other. As a result, the surface portions of the single crystal silicon layer 190, including excessive hydrogen atoms or defects caused by the cleavage or separation, can be removed. The surface portions to be removed preferably have a thickness of at least 150 nm, more preferably 200 nm or more.

In this preferred embodiment, the second SiO$_2$ film 230 is removed to a depth of about 50 to 100 nm by an RIE process using a mixture of CHF$_3$, CF$_4$ and Ar gases, and then the single crystal silicon layer 190 is removed to a depth of about 300 nm by an RIE process using a mixture of Cl$_2$, HBr, He and O$_2$ gases (not shown).

In this manner, a bonded substrate 601, in which the single crystal silicon layer 190 has been bonded to the supporting substrate 100, is obtained as shown in FIG. 3D. In this preferred embodiment, the thickness of the second SiO$_2$ film 230 is approximately equal to that of the first SiO$_2$ film 210 (e.g., both may be approximately 100 nm). Thus, these insulating films 230 and 210 together make up a single insulating layer that has a substantially flat surface over the bonded substrate 601.

According to this fabricating method, the second SiO$_2$ film 230 can be defined in the area 100*p*, other than the area 100*s* where the single crystal silicon layer 190 has been bonded, so as to be self-aligned with the single crystal silicon layer 190. Thus, the level difference between the surface areas 100*s* and 100*p* on the substrate can be reduced. As a result, high-reliability single crystal Si devices and non-single crystal Si devices can be integrated together on the same substrate 601. Also, the resultant single crystal silicon layer 190 has no excessive hydrogen atoms or defects caused by the cleavage or separation. Consequently, a high-performance single crystal silicon device can be made of the single crystal silicon layer 190.

The bonded substrate 601 described above can be used effectively to make an active-matrix substrate including single crystal silicon TFTs and polysilicon TFTs.

Hereinafter, an exemplary method of fabricating single crystal silicon and polysilicon TFTs on the bonded substrate 601 will be described. In the following example, the channel region of the polysilicon TFT and the gate electrode of the single crystal silicon TFT are made of the same polysilicon film.

First, the single crystal silicon layer 190 is patterned into a predetermined shape to define a single crystal silicon semiconductor layer 190'. Next, as shown in FIG. 3E, a third SiO$_2$ film 250 (with a thickness of about 100 nm) and an a-Si film 240 (with a thickness of about 50 nm) are deposited in this order by a plasma CVD process over the bonded substrate 601. Thereafter, the substrate 601 is preferably annealed at a temperature of at least about 400° C. Then, the hydrogen atoms contained in the a-Si film 240 can be dissociated and removed. As a result, it is possible to prevent the hydrogen atoms from expanding or dissociating themselves too rapidly in the next laser crystallizing process step.

Next, the a-Si film 240 is crystallized (with a laser beam, for example) and turned into a p-Si film 240*p*. The hydrogen atoms that were contained in the a-Si film 240 have already been removed by the annealing process (as already described with reference to FIG. 3E). For that reason, in this crystallizing process step, it is possible to prevent the p-Si film 240*p* from being ruptured due to rapid expansion or dissociation of those hydrogen atoms. This crystallizing process step may be carried out by exposing the overall substrate 600 to an excimer laser beam (such as an XeCl laser beam with a wavelength of 308 nm) at an energy density of 300 to 400 mJ/cm$^2$, for example. Alternatively, the a-Si film 240 may also be crystallized by annealing the substrate 601 in a furnace. In crystallizing the a-Si film 240 with a laser beam, the a-Si film 240 melts but the underlying single crystal silicon semiconductor layer 190' does not. In addition, by performing the laser crystallizing process step, crystal defects and other defects, which were created in the single crystal silicon semiconductor layer 190' due to the implantation of hydrogen ions, can be repaired sufficiently. In crystallizing the a-Si film 240 using a furnace on the other hand, the dopant profile or crystallinity of the single crystal silicon semiconductor layer 190' is not affected at all by this crystallizing process step.

Thereafter, as shown in FIG. 3F, a photoresist pattern 500 with a predetermined shape is defined on the p-Si film 240*p*, thereby patterning the p-Si film 240*p* by an RIE process. In this manner, a plurality of gate electrodes 272 for single crystal silicon TFTs and a plurality of active regions (i.e., p-Si layer) 240' for polysilicon TFTs can be made of the same p-Si film 240*p*.

Thereafter, a gate oxide film. 260 for polysilicon TFTs is deposited as shown in FIG. 3G. Subsequently, as shown in FIG. 3H, a portion of this gate oxide film 260, which is located over the single crystal silicon semiconductor layer 190', is etched away if necessary.

This etching process step is required when the process step of introducing a dopant into the gate electrodes 272 to decrease their resistance and into the single crystal silicon semiconductor layer 190' with the gate electrodes 272 used as a mask and the process step of introducing a dopant into the p-Si layer 240' need to be carried out simultaneously under the same condition (i.e., at the same implant dose). Also, the etching process step may need to be performed when the electrical resistance of the gate electrodes 272 should be decreased by depositing a metal film of Ni or Ti, for example, on the gate electrodes 272 and turning the metal film into a silicide film. Optionally, a portion of the p-Si layer 240' may be heavily doped with dopant ions in advance.

Finally, dopant ions are implanted into the semiconductor layers 240' and 190', an interlayer dielectric film 280 is deposited over the substrate, contact holes are opened through it, and metal interconnects 300 are provided to fill those holes, all of which process steps may be performed by well known methods. Consequently, a single crystal silicon TFT 700 and a polysilicon TFT 800 can be fabricated on the same substrate as shown in FIG. 3I.

According to this method, the single crystal silicon TFT and polysilicon TFT can be fabricated efficiently on the same substrate 601. In particular, the gate electrode of the single crystal silicon TFT and the active region of the polysilicon TFT can be made simultaneously of the same p-Si film 240p, which simplifies the manufacturing process and which is an effect achieved only by this preferred embodiment.

In addition, according to the method of this preferred embodiment, the thickness of the gate insulating film of the single crystal silicon TFT (i.e., the third $SiO_2$ film 250) and that of the gate insulating film 260 of the polysilicon TFT can be controlled independently of each other. Thus, by making the gate insulating film of the single crystal silicon TFT thinner than that of the polysilicon TFT, the threshold voltage and S-coefficient of the single crystal silicon TFT can be adjusted to more desired values, which is another effect achieved by this preferred embodiment.

Embodiment 3

Hereinafter, a third specific preferred embodiment of the present invention will be described with reference to FIGS. 4A through 4H.

In the bonded substrate 602 of this preferred embodiment, a transistor structure including a single crystal silicon layer is defined on the first insulating layer 210 as shown in FIG. 4D unlike the bonded substrate 600 shown in FIG. 2D.

First, as shown in FIG. 4A, a supporting substrate 100 and a single crystal silicon substrate 201 are prepared. The supporting substrate 100 may have the same configuration as, and may be prepared by the same method as, the counterpart described for the first preferred embodiment with reference to FIG. 2A.

On the other hand, the single crystal silicon substrate 201 may be prepared in the following manner.

First, a first $SiO_2$ film 210 is deposited to a thickness of 50 nm to 100 nm, for example, on the surface of a single crystal silicon wafer. In this preferred embodiment, the first $SiO_2$ film 210 has a thickness of about 100 nm. However, if the supporting substrate 100 has no insulating film 110, then the first $SiO_2$ film 210 of the single crystal silicon substrate 200 is preferably relatively thick (e.g., in the range of 200 nm to 300 nm) to stabilize the characteristics.

In addition, a transistor structure to be single crystal silicon TFTs is preferably defined in advance on the single crystal silicon substrate 201. For example, by performing a normal IC manufacturing process (or a part of a CMOS process), gate electrodes 273, a gate insulating film, source/drain regions implanted with dopant ions, a passivation film, and a planarizing film of BPSG are formed. If the thickness of this transistor structure is reduced, single crystal silicon TFTs can be obtained. After the transistor structure has been defined, the surface of the single crystal silicon substrate 201 is planarized by a chemical-mechanical polishing (CMP) process.

In this process step of defining the transistor structure, before the gate insulating film is formed, the single crystal silicon transistor layer 191 is preferably oxidized in advance except the island-like active regions thereof. Then, the single crystal silicon transistor layer 191 can be divided for respective TFTs.

Next, a hydrogen ion implanted layer 220 is formed at a predetermined depth in the single crystal silicon substrate 201. The hydrogen ion implanted layer 220 may be produced by the same method as that already described for the first preferred embodiment. In the single crystal silicon substrate 201, the portion between the hydrogen ion implanted layer 220 and the first $SiO_2$ film 210 will be referred to herein as a "single crystal silicon transistor layer" 191, while the other portion deeper than the hydrogen ion implanted layer 220 will be referred to herein as a "bulk portion" 201b. The single crystal silicon transistor layer 191 and the first $SiO_2$ film 210 will be collectively referred to herein as a "surface region" 201a.

Thereafter, the surfaces of the supporting substrate 100 and single crystal silicon substrate 201 are ultrasonic cleaned (may even be megasonic cleaned) in an SC-1 solution (i.e., a mixture of ammonia, hydrogen peroxide and deionized water) and then rinsed with ultrapure water, thereby removing foreign particles from the surfaces and activating the surface of these substrates.

Subsequently, as shown in FIG. 4B, the single crystal silicon substrate 201 and the supporting substrate 100 are bonded together in a predetermined area (i.e., single crystal semiconductor device area) 100s at room temperature, thereby obtaining a bonded substrate. In this process step, these substrates 201 and 100 are bonded together such that the insulating film 110 of the supporting substrate 100 contacts with the first $SiO_2$ film 210 or BPSG of the single crystal silicon substrate 201. The remaining surface area of the supporting substrate 100, other than the area 100s to which the single crystal silicon substrate 201 has been bonded, will be referred to herein as a "non-single crystal semiconductor device area" 100p.

Next, as shown in FIG. 4C, a second $SiO_2$ film 230 and an a-Si film 240 are deposited in this order to thicknesses of about 100 nm and about 50 nm, respectively, by a plasma CVD process, for example, so as to cover the entire exposed surface of the bonded substrate. The thickness of the second $SiO_2$ film 230 is preferably approximately equal to that of the first $SiO_2$ film 210. These films 230 and 240 may be deposited by the same method as that already described with reference to FIG. 2C.

Thereafter, the bonded substrate is preferably annealed at a temperature of at least about 400° C., more preferably at a temperature of 500° C. to 650° C. (more particularly, equal to or lower than 600° C.). As a result of this heat treatment, hydrogen atoms dissociate themselves from the a-Si film 240 and the single crystal silicon substrate 201 splits along the hydrogen ion implanted layer 220. That is to say, the bulk portion 201b of the single crystal silicon substrate 201 comes off the bonded substrate. At the same time, portions of the second $SiO_2$ film 230 and a-Si film 240, which have covered the exposed lower and side surfaces of the single crystal silicon substrate 201, are also lifted off. Consequently, as shown in FIG. 4D, the surface region 201a of the single crystal silicon substrate 201 (i.e., the first $SiO_2$ film 210 and the single crystal silicon transistor layer 191) remains in the single crystal semiconductor device area 100s of the supporting substrate 100, while the second $SiO_2$ film 230 (with a thickness of 100 nm, for example) and the a-Si (or already polycrystalline) film 240 (with a thickness of 50 nm, for example) are left in the non-single crystal semiconductor device area 100p.

In this manner, the bonded substrate 602 shown in FIG. 4D is obtained. In this preferred embodiment, the thickness of the second $SiO_2$ film 230 is approximately equal to that of the first $SiO_2$ film 210. Thus, these insulating films 230 and 210 together make up a single insulating layer that has a substantially flat surface over the bonded substrate 602.

According to this fabricating method, the second $SiO_2$ film 230 can be defined in the area 100p, other than the area 100s where the single crystal silicon transistor layer 191 has been bonded, so as to be self-aligned with the single crystal silicon transistor layer 191. Thus, the level difference between the surface areas 100s and 100p on the substrate can be reduced. As a result, high-reliability single crystal Si devices and non-single crystal Si devices can be integrated together on the same substrate 602. Also, according to this preferred embodiment, a non-single crystal silicon device can be fabricated easily on the second $SiO_2$ film 230 by using the a-Si film 240. In that case, the non-single crystal silicon device (e.g., a non-single crystal silicon TFT) can be fabricated with a good yield, which is an effect achieved by this preferred embodiment. For example, by fabricating a single crystal silicon TFT (made of the single crystal silicon transistor layer 191) and a polysilicon TFT on the same substrate 602, an active-matrix substrate can be made.

Hereinafter, an exemplary method for making an active-matrix substrate with the substrate 602 will be described with reference to the accompanying drawings.

First, the a-Si film 240 is crystallized (with a laser beam, for example) and turned into a p-Si film 240p. The a-Si film 240 may be crystallized by the same method as that already described with reference to FIG. 2D. This crystallizing process step may be carried out by exposing the overall substrate 602 to an excimer laser beam (such as an XeCl laser beam with a wavelength of 308 nm), for example. Alternatively, the a-Si film 240 may also be crystallized by annealing the substrate 602 in a furnace. In any case, the single crystal silicon transistor layer 191 is preferably sufficiently thick. This is because in such a rather thick single crystal silicon transistor layer 191, its surface melts but the inside portion thereof does not. More particularly, the single crystal silicon transistor layer 191 preferably has a thickness of at least 300 nm, more preferably 500 nm or more (e.g., about 500 nm). In addition, by performing any of these crystallizing process steps, crystal defects and other defects, which were created in the single crystal silicon transistor layer 191 due to the implantation of hydrogen ions, can be repaired sufficiently.

Subsequently, as shown in FIG. 4E, portions of the second $SiO_2$ film 230, which are exposed around the single crystal silicon transistor layer 191, are selectively etched away by a reactive ion etching (RIE) process, which is a kind of anisotropic etching process. In this preferred embodiment, those exposed portions of the second $SiO_2$ film 230 are selectively removed to a depth corresponding with the thickness of the p-Si film 240p (e.g., about 50 nm) by an RIE process using a mixture of $CHF_3$, $CF_4$ and Ar gases. Next, with the p-Si film 240p masked with a photoresist 501, the single crystal silicon transistor layer 191 is etched so as to have a predetermined thickness. This etching process may be carried out by RIE process using a mixture of $Cl_2$, HBr, He and $O_2$ gases, for example. As a result, hydrogen atoms and defects that have been produced due to the cleavage or separation can be removed from around the surface of the single crystal silicon transistor layer 191. The present inventors confirmed via experiments that to remove those hydrogen atoms or defects sufficiently, the single crystal silicon transistor layer 191 needs to be etched to at least 150 nm, preferably 200 nm or more. In this preferred embodiment, the single crystal silicon transistor layer 191 is etched to a depth of about 400 nm as measured from the surface.

Thereafter, as shown in FIG. 4F, a photoresist pattern 500 with a predetermined shape is defined on the single crystal silicon transistor layer 191 and p-Si film 240p.

Then, as shown in FIG. 4G, the p-Si film 240p is patterned into island shapes by an RIE process, thereby making a p-Si semiconductor layer 240'. Thereafter, a gate oxide film 260 is deposited over the p-Si semiconductor layer 240'. Subsequently, gate electrodes 274 are formed so as to overlap with portions of the p-Si semiconductor layer 240' to be channel regions and dopant ions are implanted into the p-Si semiconductor layer 240' by known methods.

Finally, an interlayer dielectric film 280 is deposited over the substrate, contact holes are opened through it, and metal interconnects 300 are provided to fill those holes, all of which process steps may be performed by well known methods. Consequently, a single crystal silicon TFT 700 and a polysilicon TFT 800 can be fabricated on the same substrate as shown in FIG. 4H.

According to this method, a single crystal silicon TFT and a polysilicon TFT can be fabricated efficiently on the same substrate 602. Among other things, an amorphous silicon film is preferably provided before an annealing process is carried out to separate the bulk portion of the single crystal silicon substrate. This is because by performing the annealing process, not just can the single crystal silicon substrate be separated but also can hydrogen atoms be removed from the amorphous silicon film then. Consequently, without separately providing an additional process step of removing hydrogen atoms from the amorphous silicon film, it is possible to prevent the amorphous silicon film from being ruptured due to too rapid expansion or dissociation of those hydrogen atoms while the amorphous silicon film is being crystallized with a laser beam.

Embodiment 4

Hereinafter, a fourth specific preferred embodiment of the present invention will be described with reference to FIGS. 5A through 5H.

In the bonded substrate 603 of this, preferred embodiment, a transistor structure including a single crystal silicon layer is defined on the first insulating layer 210 as shown in FIG. 5E. In the other respects, the substrate 603 of the fourth preferred embodiment has the same configuration as the substrate 601 shown in FIG. 3D.

The bonded substrate 603 may be made by the following method, for example.

First, as shown in FIG. 5A, a supporting substrate 100 and a single crystal silicon substrate 201 are prepared. Each of the supporting substrate 100 and single crystal silicon substrate 201 may have the same configuration as, and may be prepared by the same method as, the counterpart that has already been described for the third preferred embodiment with reference to FIG. 4A.

Subsequently, by the same method as that already described with reference to FIG. 4B, the single crystal silicon substrate 201 and the supporting substrate 100 are bonded together in a predetermined area 100s (i.e., single crystal semiconductor device area) at room temperature, thereby obtaining a bonded substrate as shown in FIG. 5B.

Next, as shown in FIG. 5C, a second $SiO_2$ film 230 is deposited to a thickness of about 100 nm by a plasma CVD process so as to cover the entire exposed surface of the bonded substrate. In depositing the second $SiO_2$ film 230, the temperature of the bonded substrate is preferably maintained at least equal to 100° C. (more preferably 250° C. or more) but at most equal to the hydrogen dissociation temperature (e.g., equal to or lower than 350° C.). As a result, without allowing the bulk portion 201b to cleave or separate from the single crystal silicon substrate 201, some of the hydrogen bonds can be turned into stronger Si—O—Si bonds at the interface between the supporting substrate 100 and the single crystal silicon substrate 201. As a result, the bond strength can be increased.

Thereafter, the bonded substrate is preferably annealed at a temperature of at least about 400° C., more preferably at a temperature of 500° C. to 600° C. As a result of this heat treatment, the single crystal silicon substrate 201 splits along the hydrogen ion implanted layer 220. That is to say, the bulk portion 201*b* of the single crystal silicon substrate 201 comes off the bonded substrate. At the same time, portions of the second $SiO_2$ film 230, which have covered the exposed lower and side surfaces of the single crystal silicon substrate 201, are also lifted off. Consequently, as shown in FIG. 5D, the surface region 201*a* of the single crystal silicon substrate 201 (i.e., the first $SiO_2$ film 210 with a thickness of 700 to 900 nm, for example, and the single crystal silicon transistor layer 191 with a thickness of 400 nm, for example) remains in the single crystal semiconductor device area 100*s* of the supporting substrate 100, while the second $SiO_2$ film 230 (with a thickness of 800 to 1,000 nm, for example) is left in the non-single crystal semiconductor device area 100*p*.

Subsequently, surface portions of the second $SiO_2$ film 230 and single crystal silicon transistor layer 191 are sequentially removed by a reactive ion etching (RIE) process, which is a kind of anisotropic etching process. Alternatively, the surface portions of the second $SiO_2$ film 230 and single crystal silicon transistor layer 191 may also be removed at the same time by adjusting the compositions of gases such that their etch rates become substantially equal to each other. As a result, the surface portions of the single crystal silicon transistor layer 191, including excessive hydrogen atoms or rare gas atoms or defects caused by the cleavage or separation, can be removed. The surface portions to be removed preferably have a thickness of at least 150 nm, more preferably 200 nm or more.

In this preferred embodiment, the second $SiO_2$ film 230 is removed to a depth of about 300 nm by an RIE process using a mixture of $CHF_3$, $CF_4$ and Ar gases, and then the single crystal silicon transistor layer 191 is removed to a depth of about 300 nm by an RIE process using a mixture of $Cl_2$, HBr, He and $O_2$ gases (as shown in FIG. 5E).

In this manner, a bonded substrate 603, in which the single crystal silicon transistor layer 191 has been bonded to the supporting substrate 100, is obtained as shown in FIG. 5E. In this preferred embodiment, the thickness of the second $SiO_2$ film 230 is approximately equal to that of the first $SiO_2$ film 210 (e.g., both may be approximately 700 to 800 nm). Thus, these insulating films 230 and 210 together make up a single insulating layer that has a substantially flat surface over the bonded substrate 603.

According to this fabricating method, the second $SiO_2$ film 230 can be defined in the area 100*p*, other than the area 100*s* where the single crystal silicon transistor layer 191 has been bonded, so as to be self-aligned with the single crystal silicon transistor layer 191. Thus, the level difference between the surface areas 100*s* and 100*p* on the substrate can be reduced. As a result, high-reliability single crystal Si devices and non-single crystal Si devices can be integrated together on the same substrate 603. Also, excessive hydrogen atoms or defects caused by the cleavage or separation are removed from the single crystal silicon transistor layer 191. Consequently, a high-performance single crystal silicon device can be made of the single crystal silicon transistor layer 191. The substrate 603 can be used effectively to make an active-matrix substrate including a single crystal silicon TFT and a polysilicon TFT.

Hereinafter, an exemplary method of fabricating single crystal silicon and polysilicon TFTs on the bonded substrate 603 will be described.

First, with the temperature of the bonded substrate 603 maintained within the range of about 250° C. to about 350° C., a third $SiO_2$ film 250 (with a thickness of about 800 nm) and an a-Si film 240 (with a thickness of about 50 nm) are deposited in this order by a plasma CVD process over the bonded substrate 603. Thereafter, the substrate 603 is preferably annealed at a temperature of at least about 400° C. Then, the hydrogen atoms contained in the a-Si film 240 can be dissociated and removed. As a result, it is possible to prevent the hydrogen atoms from expanding or dissociating themselves too rapidly in the next laser crystallizing process step. Next, the a-Si film 240 is crystallized (with a laser beam, for example) and turned into a p-Si film 240*p* as shown in FIG. 5F. The hydrogen atoms that were contained in the a-Si film 240 have already been removed by the annealing process. For that reason, in this crystallizing process step, it is possible to prevent the p-Si film 240*p* from being ruptured due to rapid expansion or dissociation of those hydrogen atoms. This crystallizing process step may be carried out by exposing the overall substrate 603 to an excimer laser beam (such as an XeCl laser beam with a wavelength of 308 nm) at an energy density of 300 to 400 $mJ/cm^2$, for example. Alternatively, the a-Si film 240 may also be crystallized by annealing the substrate 603 in a furnace. By performing this crystallizing process step, the dopant profile or crystallinity of the single crystal silicon semiconductor layer 190' under the third $SiO_2$ film 250 is not affected at all. Thereafter, a photoresist pattern 500 with a predetermined shape is defined on the p-Si film 240*p*.

Subsequently, as shown in FIG. 5G, the p-Si film 240*p* is patterned by an RIE process, thereby making a plurality of active regions 240' for polysilicon TFTs. Then, a gate oxide film 260 for the polysilicon TFTs is deposited. Thereafter, gate electrodes 273 are provided by a well known method for the polysilicon TFTs on the gate oxide film 260. Specifically, the gate electrodes 273 may be formed by depositing a conductor film over the surface of the substrate and then etching the conductor film. In this case, the conductor film is deposited on a substantially flat surface with no big level differences, and therefore, it is possible to prevent non-etched excessive portions of the conductor film from being left in unexpected areas. After that, using the gate electrodes 273 as a mask, dopant ions are implanted into the p-Si semiconductor layer 240'. According to the device size, operating voltage, required reliability or any other specification, a sidewall, an LDD structure that uses a masking pattern or a structure that minimizes short channel effects may need to be provided.

Finally, an interlayer dielectric film 280 is deposited over the substrate, contact holes are opened through it, and metal interconnects 300 are provided to fill those holes, all of which process steps may be performed by well known methods. Consequently, a single crystal silicon TFT 700 and a polysilicon TFT 800 can be fabricated on the same substrate as shown in FIG. 5H.

According to various preferred embodiments of the present invention described above, in a semiconductor device in which a single crystal silicon layer has been transferred onto a supporting substrate by bonding a single crystal silicon substrate, including an ion implanted layer to which hydrogen ions and/or ions of a rare gas have been implanted, to the supporting substrate, the level difference between the area to which the single crystal silicon substrate has been bonded and the other area can be reduced significantly. Thus, preferred embodiments of the present invention provide a high-reliability device with the decrease in yield due to disconnection or short-circuit minimized. For example, a single crystal Si device and a non-single crystal (i.e., polycrystalline or amorphous) Si device can be integrated together on the same substrate without decreasing their reliability. The present invention is particularly beneficial in that two different types of devices can be fabricated monolithically on the same big glass substrate, for example, at a good yield by taking advantage of single crystal silicon and non-single crystal silicon, respectively.

In addition, preferred embodiments of the present invention also provide a method of making a substrate, which includes a single crystal silicon layer on the surface and which has a reduced level difference on the surface, and a method for fabricating an electronic device including such a substrate. In a preferred embodiment in which a single crystal Si device and a non-single crystal Si device are integrated together on the same substrate, hydrogen atoms are preferably removed from the a-Si film to facilitate the laser crystallization while the substrate is being annealed to split the single crystal silicon substrate along the ion implanted layer. Then, the manufacturing process can be simplified.

According to various preferred embodiments of the present invention described above, a much smaller level difference is created on the surface of a substrate when a single crystal semiconductor layer is bonded onto the substrate. Thus, a bonded substrate, on which not just a single crystal semiconductor device but also a high-reliability non-single crystal semiconductor device can be integrated together, is provided. In addition, a substrate including such a single crystal semiconductor layer can be easily obtained, too.

Furthermore, by using such a substrate with a single crystal semiconductor layer, a high-reliability electronic device, including a single crystal semiconductor device and a non-single crystal semiconductor device, can be provided. Examples of such electronic devices include active-matrix substrates, LCDs and organic EL displays.

The present invention can be used effectively in an active-matrix substrate, in which peripheral drivers and controllers are integrated together, and in an active-matrix-addressed LCD that uses such an active-matrix substrate. Among other things, if an outstandingly high-performance circuit, made up of TFTs that use a single crystal silicon layer as their channel regions, and other circuits are integrated together on the same substrate, then a high value added, highly functional display system is realized.

What is more, according to various preferred embodiments of the present invention described above, a thin film device of single crystal Si and a thin film device of non-single crystal Si can be fabricated monolithically on the same substrate without decreasing their reliability or increasing the number of manufacturing process steps. For example, a so-called "system on panel", in which high value added circuits are integrated together monolithically, can be fabricated easily.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

This non-provisional application claims priority under 35 USC § 119(a) on Patent Application No. 2004-032891 filed in Japan on Feb. 10, 2004, the entire contents of which are hereby incorporated by reference.

What is claimed is:

1. A semiconductor device comprising a substrate with an insulating surface and a single crystal semiconductor layer, which is bonded to the insulating surface of the substrate, wherein the device further includes:
   a first insulating layer, which is provided between the insulating surface of the substrate and the single crystal semiconductor layer,
   a second insulating layer provided on the entire insulating surface of the substrate except an area in which the first insulating layer is present; and
   wherein at least part of an upper surface of the second insulating layer is coplanar with an upper surface of the first insulating layer and/or is located at an elevation no higher than an elevation of a bottom surface of the single crystal semiconductor layer.

2. The semiconductor device of claim 1, wherein every edge of the second insulating layer is aligned with its associated edge of the first insulating layer.

3. The semiconductor device of claim 1, further comprising a non-single crystal semiconductor layer on the second insulating layer.

4. A semiconductor device comprising:
   a substrate with an insulating surface and a single crystal semiconductor layer, which is bonded to the insulating surface of the substrate,
   wherein the device further includes:
   a first insulating layer, which is provided between the insulating surface of the substrate and the single crystal semiconductor layer,
   a second insulating layer provided on the entire insulating surface of the substrate except an area in which the first insulating layer is present; and
   wherein the thickness of the first insulating layer is substantially equal to that of the second insulating layer.

5. An electronic device including semiconductor devices, the electronic device comprising:
   a substrate with an insulating surface;
   a single crystal semiconductor layer, which is bonded onto a selected area of the insulating surface of the substrate;
   a first insulating layer, which is provided between the insulating surface of the substrate and the single crystal semiconductor layer;
   a second insulating layer provided on the entire insulating surface except the selected area where the first insulating layer is present;
   a single crystal semiconductor device, which has been fabricated over the first insulating layer so as to include at least a portion of the single crystal semiconductor layer; and
   a non-single crystal semiconductor device, which has been fabricated on the second insulating layer, and wherein the single crystal semiconductor device is a thin film transistor, and the non-single crystal semiconductor device is another thin film transistor.

6. The electronic device of claim 5, wherein every edge of the second insulating layer is aligned with its associated edge of the first insulating layer.

7. The electronic device of claim 5, wherein the non-single crystal semiconductor device includes at least a portion of a non-single crystal semiconductor layer provided on the second insulating layer.

8. An electronic device including semiconductor devices, the electronic device comprising:
  a substrate with an insulating surface;
  a single crystal semiconductor layer, which is bonded onto a selected area of the insulating surface of the substrate;
  a first insulating layer, which is provided between the insulating surface of the substrate and the single crystal semiconductor layer;
  a second insulating layer provided on the entire insulating surface except the selected area where the first insulating layer is present;
  a single crystal semiconductor device, which has been fabricated over the first insulating layer so as to include at least a portion of the single crystal semiconductor layer;
  a non-single crystal semiconductor device, which has been fabricated on the second insulating layer; and
  wherein the thickness of the first insulating layer is substantially equal to that of the second insulating layer.

9. An electronic device including semiconductor devices, the electronic device comprising:
  a substrate with an insulating surface;
  a single crystal semiconductor layer, which is bonded onto a selected area of the insulating surface of the substrate;
  a first insulating layer, which is provided between the insulating surface of the substrate and the single crystal semiconductor layer;
  a second insulating layer provided on the entire insulating surface except the selected area where the first insulating layer is present;
  a single crystal semiconductor device, which has been fabricated over the first insulating layer so as to include at least a portion of the single crystal semiconductor layer;
  a non-single crystal semiconductor device, which has been fabricated on the second insulating layer;
  wherein the non-single crystal semiconductor device includes at least a portion of a non-single crystal semiconductor layer provided on the second insulating layer; and
  wherein the single crystal semiconductor device is a thin-film transistor, which includes at least the portion of the single crystal semiconductor layer as a channel region, and
  wherein the non-single crystal semiconductor device is a thin-film transistor, which includes at least the portion of the non-single crystal semiconductor layer as a channel region.

10. An electronic device including semiconductor devices, the electronic device comprising:
  a substrate with an insulating surface;
  a single crystal semiconductor layer, which is bonded onto a selected area of the insulating surface of the substrate;
  a first insulating layer, which is provided between the insulating surface of the substrate and the single crystal semiconductor layer;
  a second insulating layer, which has been deposited on the entire insulating surface except the selected area where the first insulating layer is present;
  a single crystal semiconductor device, which has been fabricated over the first insulating layer so as to include at least a portion of the single crystal semiconductor layer;
  a non-single crystal semiconductor device, which has been fabricated on the second insulating layer;
  wherein the non-single crystal semiconductor device includes at least a portion of a non-single crystal semiconductor layer provided on the second insulating layer;
  wherein the single crystal semiconductor device is a thin-film transistor, which includes at least the portion of the single crystal semiconductor layer as a channel region,
  wherein the non-single crystal semiconductor device is a thin-film transistor, which includes at least the portion of the non-single crystal semiconductor layer as a channel region;
  a third insulating layer, which is located between the second insulating layer and the non-single crystal semiconductor layer and between the single crystal semiconductor layer and the non-single crystal semiconductor layer,
  wherein the single crystal semiconductor device further includes a gate electrode on the third insulating layer, and
  wherein the non-single crystal semiconductor device further includes a gate insulating film, which covers the non-single crystal semiconductor layer, and a gate electrode on the gate insulating film, and
  wherein the third insulating layer is thinner than the gate insulating film of the non-single crystal semiconductor device.

11. An electronic device including semiconductor devices, the electronic device comprising:
  a substrate with an insulating surface;
  a single crystal semiconductor layer, which is bonded onto a selected area of the insulating surface of the substrate;
  a first insulating layer, which is provided between the insulating surface of the substrate and the single crystal semiconductor layer;
  a second insulating layer, which has been deposited on the entire insulating surface except the selected area where the first insulating layer is present;
  a single crystal semiconductor device, which has been fabricated over the first insulating layer so as to include at least a portion of the single crystal semiconductor layer;
  a non-single crystal semiconductor device, which has been fabricated on the second insulating layer;
  wherein the non-single crystal semiconductor device includes at least a portion of a non-single crystal semiconductor layer provided on the second insulating layer;
  wherein the single crystal semiconductor device is a thin-film transistor, which includes at least the portion of the single crystal semiconductor layer as a channel region,
  wherein the non-single crystal semiconductor device is a thin-film transistor, which includes at least the portion of the non-single crystal semiconductor layer as a channel region; and
  wherein a gate electrode of the single crystal semiconductor device and a channel region of the non-single crystal semiconductor device are made of the same polycrystalline semiconductor film.

12. A semiconductor device comprising
a substrate having an $SiO_2$ film on the surface; and
a single crystal silicon layer, which is bonded to a surface of the $SiO_2$ film,
wherein the device further includes:
a first $SiO_2$ layer, which is provided between the surface of the $SiO_2$ film and the single crystal silicon layer,
a second $SiO_2$ layer, which has been provided on the entire surface of the $SiO_2$ film except an area in which the first $SiO_2$ layer is present; and
wherein at least part of an upper surface of the second $SiO_2$ layer is coplanar with an upper surface of the first $SiO_2$ layer and/or is located at an elevation no higher than an elevation of a bottom surface of the single crystal silicon layer.

13. A semiconductor device comprising:
a substrate having an $SiO_2$ film on a surface thereof;
a single crystal silicon layer which is bonded to a surface of the $SiO_2$ film;
a first $SiO_2$ layer which is provided between the surface of the $SiO_2$ film and the single crystal silicon layer,
a second $SiO_2$ layer provided on the entire surface of the $SiO_2$ film except an area in which the first $SiO_2$ layer is present; and
wherein a thickness of the first $SiO_2$ layer is substantially equal to a thickness of the second $SiO_2$ layer.

* * * * *